United States Patent
Wang et al.

(10) Patent No.: US 11,967,274 B2
(45) Date of Patent: Apr. 23, 2024

(54) DISPLAY SUBSTRATE, DISPLAY PANEL, AND DISPLAY DEVICE

(71) Applicants: Chengdu BOE Optoelectronics Technology Co., Ltd., Sichuan Province (CN); BOE Technology Group Co., Ltd., Beijing (CN)

(72) Inventors: Qiwei Wang, Beijing (CN); Kaipeng Sun, Beijing (CN); Jianchang Cai, Beijing (CN); Chao Wu, Beijing (CN); Yuanjie Xu, Beijing (CN); Yao Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/250,324

(22) PCT Filed: Oct. 30, 2020

(86) PCT No.: PCT/CN2020/125229
§ 371 (c)(1),
(2) Date: Apr. 24, 2023

(87) PCT Pub. No.: WO2022/088030
PCT Pub. Date: May 5, 2022

(65) Prior Publication Data
US 2024/0021146 A1    Jan. 18, 2024

(51) Int. Cl.
*G09G 3/32* (2016.01)
*G11C 19/28* (2006.01)

(52) U.S. Cl.
CPC ............... *G09G 3/32* (2013.01); *G11C 19/28* (2013.01); *G09G 2310/0275* (2013.01); *G09G 2310/0286* (2013.01)

(58) Field of Classification Search
USPC .......................................... 345/55
See application file for complete search history.

(56) References Cited

U.S. PATENT DOCUMENTS 10,762,828 B1 * 9/2020 Ma ..................... G09G 3/2092
2016/0284298 A1    9/2016 Furuya
(Continued)

FOREIGN PATENT DOCUMENTS

CN    107749414 A    3/2018
CN    108682372 A    10/2018
(Continued)

OTHER PUBLICATIONS

International Search Report and Written Opinion, dated Jul. 26, 2021, from PCT/CN2020/125229, 20 pages.

*Primary Examiner* — Chineyere D Wills-Burns
(74) *Attorney, Agent, or Firm* — Workman Nydegger

(57) ABSTRACT

A display substrate includes a first display region, a second display region, and a frame region. Light-emitting devices include first light-emitting devices in the first display region and second light-emitting devices in the second display region. Pixel drive circuits include first pixel drive circuits in the frame region and second pixel drive circuits in the second display region. The first pixel drive circuits are electrically connected to the first light-emitting devices. The second pixel drive circuits are electrically connected to the second light-emitting devices. Each of shift registers cascaded in the frame region is connected to the first pixel drive circuits and the second pixel drive circuits which are electrically connected to one row of first light-emitting devices (Continued)

and the same one row of second light-emitting devices respectively.

19 Claims, 14 Drawing Sheets

(56) References Cited

U.S. PATENT DOCUMENTS

| | | | | |
|---|---|---|---|---|
| 2017/0004784 | A1* | 1/2017 | Cao | G09G 3/3677 |
| 2017/0193931 | A1 | 7/2017 | Han et al. | |
| 2018/0190190 | A1* | 7/2018 | Xi | G09G 3/3208 |
| 2019/0109184 | A1* | 4/2019 | Li | G06F 1/163 |
| 2019/0304558 | A1* | 10/2019 | Dun | G02F 1/136286 |
| 2020/0126466 | A1* | 4/2020 | Hosoyachi | G09G 3/3677 |
| 2020/0135832 | A1* | 4/2020 | Ma | H01L 27/14812 |
| 2020/0168141 | A1* | 5/2020 | Ma | G09G 3/035 |
| 2021/0005144 | A1* | 1/2021 | Long | G09G 3/3233 |
| 2021/0201762 | A1* | 7/2021 | He | H01L 31/125 |
| 2021/0327336 | A1* | 10/2021 | Wang | G09G 3/20 |
| 2021/0407425 | A1* | 12/2021 | Huang | G09G 3/035 |
| 2021/0408429 | A1* | 12/2021 | Yang | H10K 50/852 |
| 2022/0320146 | A1* | 10/2022 | Huang | H10K 59/123 |
| 2022/0320187 | A1* | 10/2022 | Huang | G09G 3/3225 |
| 2022/0366848 | A1* | 11/2022 | Huang | G09G 3/3266 |
| 2023/0098206 | A1* | 3/2023 | Sun | G09F 9/33 |
| | | | | 345/690 |

FOREIGN PATENT DOCUMENTS

| | | |
|---|---|---|
| CN | 110491905 A | 11/2019 |
| CN | 110796992 A | 2/2020 |
| CN | 111028757 A | 4/2020 |
| CN | 111160287 A | 5/2020 |
| CN | 111341813 A | 6/2020 |
| CN | 111477676 A | 7/2020 |
| CN | 111508377 A | 8/2020 |
| CN | 111610676 A | 9/2020 |
| CN | 111653196 A | 9/2020 |

* cited by examiner

-- Prior Art --

DISPLAY SUBSTRATE, DISPLAY PANEL, AND DISPLAY DEVICE

CROSS-REFERENCE TO RELATED APPLICATIONS

This application is a National Stage of International Application No. PCT/CN2020/125229, filed Oct. 30, 2020, the entire content of which is hereby incorporated by reference.

FIELD

The present disclosure relates to the technical field of display, in particular to a display substrate, a display panel and a display apparatus.

BACKGROUND

With rapid development of smart phones, it not only requires attractive appearances of phones, but also needs to give consideration to bring more excellent visual experience for phone users. Manufacturers begin to increase a screen-to-body ratio on the smart phones, such that full-screen has become a novel competitive point of the smart phones. With development of the full-screen, promoting requirement on the performance and functions is also increasing every day. Under-screen cameras, on the premise of not affecting a high screen-to-body ratio, can bring a sense of impact on the visual and use experience to a certain extent.

SUMMARY

In an aspect, embodiments of the present disclosure provide a display substrate, including:

a base substrate, including a display region and a frame region around the display region, wherein the display region includes a first display region and a second display region at least located on one side of the first display region;

a plurality of light-emitting devices, arranged on the base substrate in an array and including a plurality of first light-emitting devices located in the first display region and a plurality of second light-emitting devices located in the second display region;

a plurality of pixel drive circuits, located between the base substrate and a layer where the plurality of light-emitting devices are located; wherein the plurality of pixel drive circuits include a plurality of first pixel drive circuits located in the frame region and a plurality of second pixel drive circuits located in the second display region; wherein the plurality of first pixel drive circuits are electrically connected to the plurality of first light-emitting devices in a one-to-one correspondence manner, and the plurality of second pixel drive circuits are electrically connected to the plurality of second light-emitting devices in a one-to-one correspondence manner; and a plurality of shift registers cascaded in the frame region, each shift register being correspondingly connected to the first pixel drive circuits and the second pixel drive circuits which are electrically connected to one row of first light-emitting devices and one row of second light-emitting devices respectively; and the one row of first light-emitting devices and the one row of second light-emitting devices being located in the same row.

Optionally, in the above display substrate provided by the embodiments of the present disclosure, the frame region includes a first frame region adjacent to the first display region, a second frame region opposite to the first frame region, and a third frame region and a fourth frame region which are connected to the first frame region and the second frame region.

The plurality of first pixel drive circuits are located in the first frame region, and the plurality of shift registers are located in at least one of the third frame region and the fourth frame region.

The display substrate further includes a plurality of wires located in at least one of the third frame region and the fourth frame region adjacent to the first display region and in the first frame region; wherein, one end of each wire is correspondingly connected to one of the shift registers, the other end is correspondingly connected to at least one of the first pixel drive circuits, and the first light-emitting devices electrically connected to the at least one of the first pixel drive circuits respectively are arranged in the same row.

Optionally, in the above display substrate provided by the embodiments of the present disclosure, the plurality of cascaded shift registers are divided into two groups, one group of the plurality of cascaded shift registers are at least located in the third frame region, and the other group of the plurality of cascaded shift registers are at least located in the fourth frame region.

The plurality of first pixel drive circuits are located in the first frame region.

The plurality of wires are located in the third frame region and the fourth frame region adjacent to the first display region and the first frame region, wherein, each wire is correspondingly connected to one of the shift registers and the plurality of first pixel drive circuits corresponding to the adjacent half row of the first light-emitting devices.

Optionally, the above display substrate provided by the embodiments of the present disclosure includes a first gate metal layer, a second gate metal layer, a first source-drain metal layer and a second source-drain metal layer which are stacked and insulated from one another.

The plurality of wires are arranged on the same layer as at least one of the first gate metal layer, the second gate metal layer and the second source-drain metal layer.

Optionally, in the above display substrate provided by the embodiments of the present disclosure, each group of the plurality of cascaded shift registers include a plurality of first cascaded shift registers and a plurality of second cascaded shift registers.

The plurality of wires include a plurality of first wires arranged on the same layer as at least one of the first gate metal layer, the second gate metal layer and the second source-drain metal layer, and a plurality of second wires arranged on the same layer as at least one of the first gate metal layer and the second gate metal layer; each first wire is correspondingly and electrically connected to one of the first shift registers and the plurality of first pixel drive circuits corresponding to the adjacent half row of the first light-emitting devices; and each second wire is correspondingly and electrically connected to one of the second shift registers and the plurality of first pixel drive circuits corresponding to the adjacent half row of the first light-emitting devices.

Optionally, in the above display substrate provided by the embodiments of the present disclosure, the plurality of first cascaded shift registers are located between the plurality of second cascaded shift registers and the display region.

Each first wire is bent from one side of the first shift registers close to the display region to the first frame region between the first pixel drive circuits and the display region.

Each second wire is bent from one side of the second shift registers away from the display region to the first frame region between the first pixel drive circuits and the display region.

Optionally, the above display substrate provided by the embodiments of the present disclosure further includes a plurality of first switching connection lines and a plurality of second switching connection lines which are located in the first frame region and are arranged on the same layer as the first source-drain metal layer.

Each first switching connection line is connected to one of the first wires and one of the first pixel drive circuits, and each second switching connection line is connected to one of the second wires and one of the first pixel drive circuits.

Optionally, the above display substrate provided by the embodiments of the present disclosure further includes a plurality of grid lines and a plurality of light-emitting control lines which are located in the second display region and are arranged on the same layer as the first gate metal layer, and a plurality of third switching connection lines and a plurality of fourth switching connection lines which are located in the third frame region and the fourth frame region and are arranged on the same layer as the first source-drain metal layer.

Each grid line is electrically connected to the half row of second pixel drive circuits, and is electrically connected to one of the first shift registers through one of the third switching connection lines.

Each light-emitting control line is electrically connected to the half row of second pixel drive circuits, and is electrically connected to one of the second shift registers through one of the fourth switching connection lines.

Optionally, the above display substrate provided by the embodiments of the present disclosure further includes a plurality of data lines located in the second display region. Each data line is correspondingly connected to the first pixel drive circuits and the second pixel drive circuits which are electrically connected to one column of first light-emitting devices and one column of second light-emitting devices respectively, and the column of first light-emitting devices and the column of second light-emitting devices are arranged in the same column.

Optionally, the above display substrate provided by the embodiments of the present disclosure further includes a plurality of third wires extending in a row direction and a plurality of fourth wires extending in a column direction in the second display region.

The data line directly facing the first display region is connected to the plurality of fourth wires through one of the third wires, each fourth wire is correspondingly and electrically connected to one of the first pixel drive circuits, and the first light-emitting devices corresponding to the first pixel drive circuits electrically connected to the at least one of the fourth wires respectively are arranged in the same column.

Optionally, in the above display substrate provided by the embodiments of the present disclosure, the third wires are respectively located in a plurality of row gaps adjacent to the first display region, and two third wires are arranged in the same row gap.

The fourth wires are arranged in a plurality of column gaps of two sides, in the row direction, of the first display region in a one-to-one correspondence manner.

Optionally, the above display substrate provided by the embodiments of the present disclosure further includes a plurality of fifth switching connection lines located in the frame region adjacent to the first display region.

Each fifth switching connection line is correspondingly connected to one of the fourth wires and one of the first pixel drive circuits.

Optionally, the above display substrate provided by the embodiments of the present disclosure includes a first gate metal layer, a second gate metal layer, a first source-drain metal layer and a second source-drain metal layer which are stacked and insulated from one another.

The data lines and the plurality of fifth switching connection lines are arranged on the same layer as the first source-drain metal layer, the plurality of third wires are arranged on the same layer as the second gate metal layer, and the plurality of fourth wires are arranged on the same layer as the second source-drain metal layer.

Optionally, the above display substrate provided by the embodiments of the present disclosure further includes a plurality of power signal lines extending in a column direction. One of the power signal lines is electrically connected to one column of second pixel drive circuits. Alternatively, one of the power signal lines is electrically connected to the first pixel drive circuits and the second pixel drive circuits in the same column.

Optionally, the above display substrate provided by the embodiments of the present disclosure further includes a plurality of initialized signal lines extending in a row direction in the second display region, and a plurality of sixth switching connection lines located in the frame region.

One of the initialized signal lines is electrically connected to the half row of second pixel drive circuits, and each of the initialized signal lines located on the two sides, in the row direction, of the first display region is electrically connected to the first pixel drive circuits corresponding to the first light-emitting devices in the row through one of the sixth switching connection lines.

Optionally, the above display substrate provided by the embodiments of the present disclosure further includes a plurality of transparent wires located between a layer where the plurality of pixel drive circuits are located and a layer where the plurality of light-emitting devices are located. The transparent wires are connected to a position between the first pixel drive circuits and the first light-emitting devices in a one-to-one correspondence manner.

Optionally, in the above display substrate provided by the embodiments of the present disclosure, the first display region is configured to install a light-extracting module.

In another aspect, embodiments of the present disclosure further provide a display panel, including the above display substrate provided by the embodiments of the present disclosure.

In yet another aspect, embodiments of the present disclosure further provide a display apparatus, including: a light-extracting module, and the above display panel provided by the embodiments of the present disclosure, wherein the light-extracting module is arranged in the first display region of the display panel.

DETAILED DESCRIPTION OF THE EMBODIMENTS

In order to make objectives, technical solutions and advantages of the embodiments of the present disclosure clearer, the technical solutions of the embodiments of the present disclosure will be clearly and completely described below with reference to the accompanying drawings of the embodiments of the present disclosure. It needs to be noted that sizes and shapes of figures in the accompanying drawings do not reflect a true scale, and are only intended to illustrate contents of the present disclosure. In addition, the same or similar labels throughout indicate the same or similar components or components having the same or similar functions. Apparently, the described embodiments are some, but not all, embodiments of the present disclosure. Based on the described embodiments of the present disclosure, all other embodiments obtained by those of ordinary skill in the art without creative work shall fall within the protection scope of the present disclosure.

Unless otherwise defined, technical or scientific terms used herein should have the ordinary meaning as understood by those of ordinary skill in the art to which the present disclosure pertains. "First", "second" and similar words used in the present Description and claims do not represent any order, quantity or importance, and are merely used to distinguish different constituent parts. "Comprise" or "include" and similar words mean that the elements or objects appearing before the words cover the elements or objects recited after the words and their equivalents, but do not exclude other elements or objects. "Inner", "outer", "up", "down" and the like are merely used to represent a relative position relationship, and after an absolute position of a described object is changed, the relative position relationship may also be changed accordingly.

Figure 1:
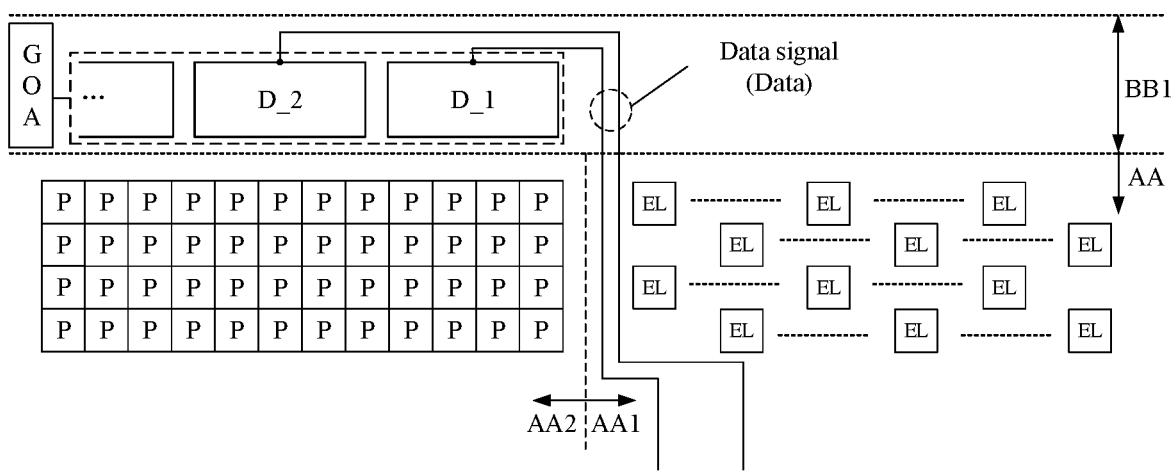
FIG. 1 is a schematic structural diagram of a display apparatus having an under-screen camera in the related art.

FIG. 1 is a planar schematic structural diagram of a display apparatus having an under-screen camera structure in the related art. As shown in FIG. 1, the display apparatus includes a first display region AA1 and a second display region AA2. The camera may be arranged in the first display region AA1. A plurality of light-emitting devices EL are arranged in the first display region AA1, and pixel drive circuits (such as D_1 and D_2 in FIG. 1) for controlling the light-emitting devices EL to emit light are located in an upper frame region BB1. A plurality of pixel drive circuits P are arranged in the second display region AA2. Each pixel drive circuit P includes one light-emitting device and a corresponding drive circuit. That is, the drive circuit in the pixel drive circuit P is located nearby the corresponding light-emitting device. In addition, as shown in FIG. 1, for the pixel drive circuits (such as D_1 and D_2 in FIG. 1) placed in the upper frame region BB1, in the related art, drive signals are provided by additionally arranged shift registers GOA. This solution is relatively complex, and the cost is higher.

Figure 2:
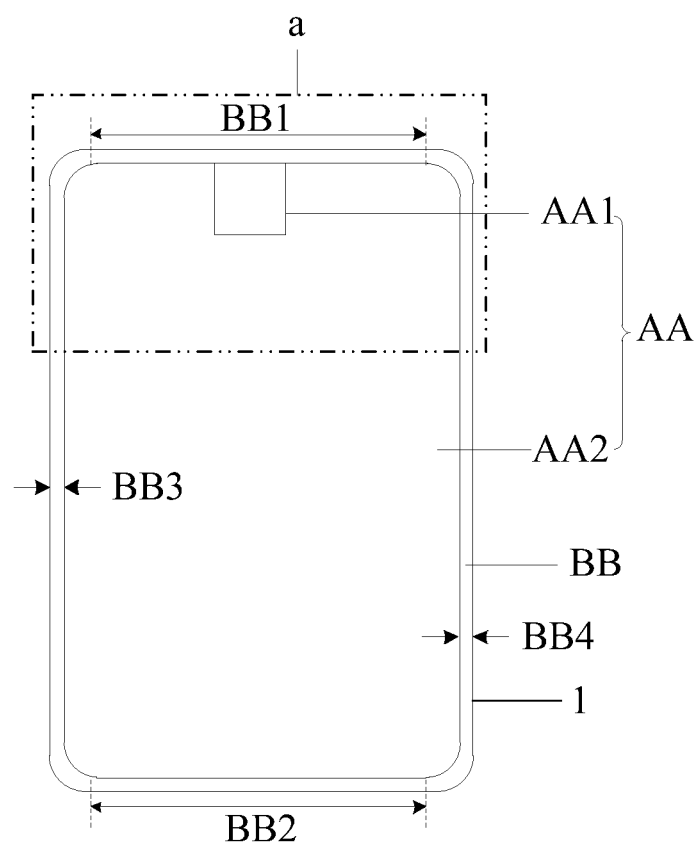
FIG. 2 is a schematic structural diagram of a display apparatus provided by an embodiment of the present disclosure.
Figure 3:
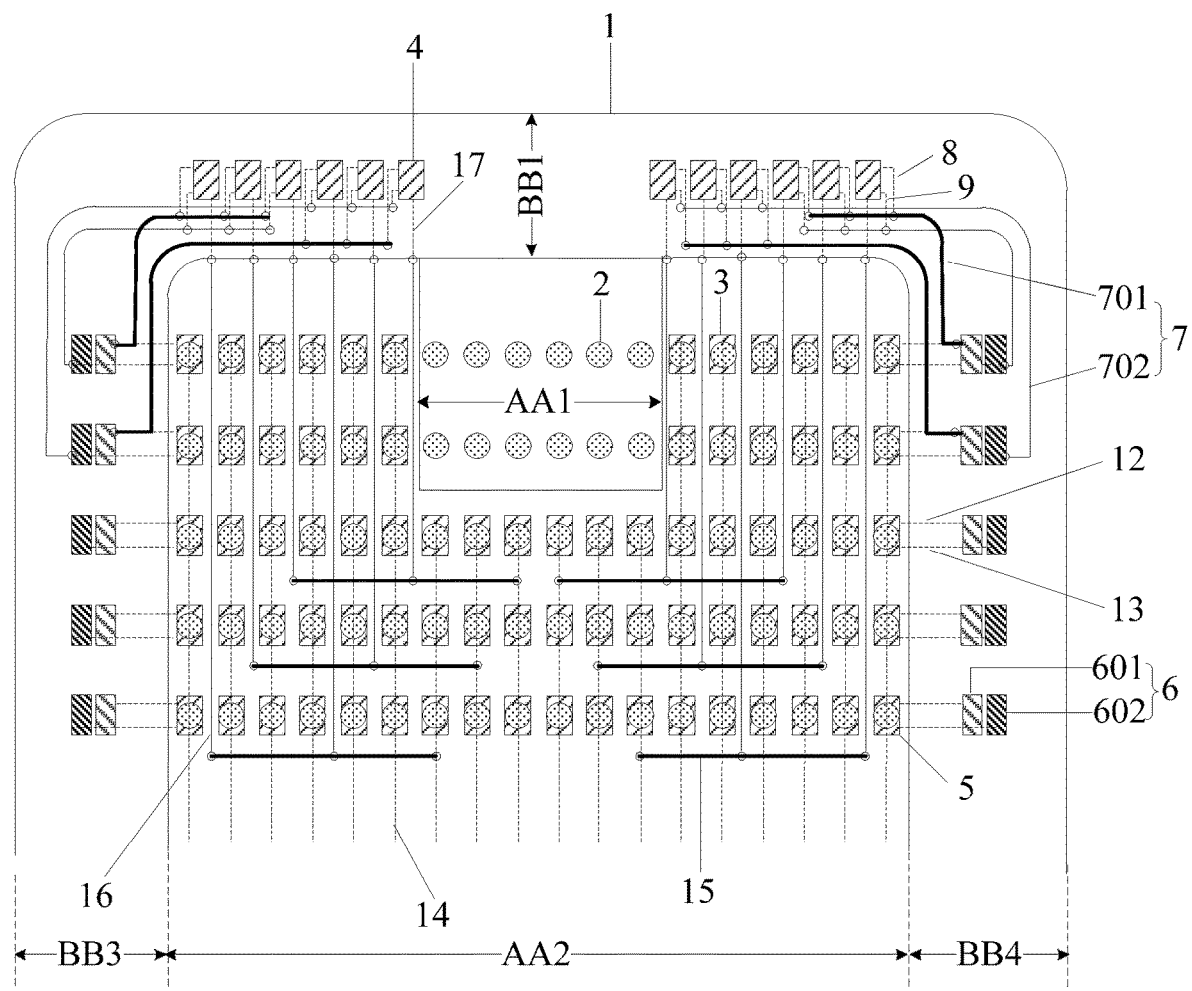
FIG. 3 is an enlarged schematic structural diagram of a region 'a' in FIG. 2.
Figure 4:
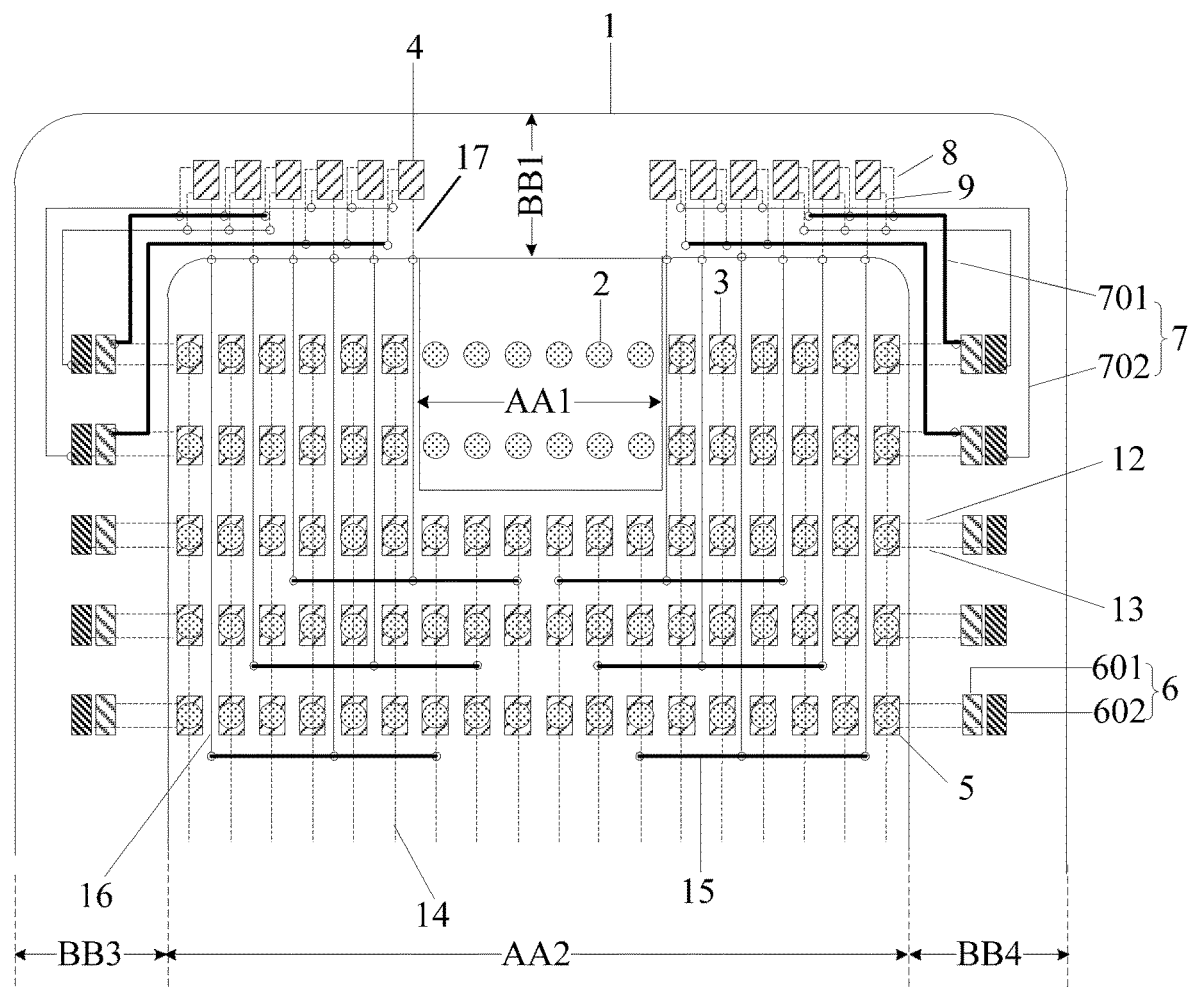
FIG. 4 is another enlarged schematic structural diagram of a region 'a' in FIG. 2.

Aiming at the above technical problem existing in the related art, embodiments of the present disclosure provide a display substrate, as shown in FIG. 2 to FIG. 4.

A base substrate 1 is included in the display substrate. The base substrate 1 includes a display region AA and a frame region BB around the display region AA. The display region AA includes a first display region AA1 and a second display region AA2 at least located on one side of the first display region AA1.

A plurality of light-emitting devices arranged on the base substrate 1 in an array are included in the display substrate. The plurality of light-emitting devices include a plurality of first light-emitting devices 2 located in the first display region AA1 and a plurality of second light-emitting devices 3 located in the second display region AA2.

A plurality of pixel drive circuits located between the base substrate 1 and a layer where the plurality of light-emitting devices are located are included in the display substrate. The plurality of pixel drive circuits include a plurality of first pixel drive circuits 4 located in the frame region BB and a plurality of second pixel drive circuits 5 located in the second display region AA2. The plurality of first pixel drive circuits 4 are electrically connected to the plurality of first light-emitting devices 2 in a one-to-one correspondence manner, and the plurality of second pixel drive circuits 5 are electrically connected to the plurality of second light-emitting devices 3 in a one-to-one correspondence manner.

A plurality of shift registers 6 cascaded in the frame region BB are included in the display substrate. Each shift register 6 is connected to the first pixel drive circuits 4 and the second pixel drive circuits 5 which are electrically connected to one row of first light-emitting devices 2 and one row of second light-emitting devices 3 respectively. The one row of first light-emitting devices 2 and the one row of second light-emitting devices 3 are located in the same row.

In the above display substrate provided by the embodiments of the present disclosure, the first pixel drive circuits 4 electrically connected to the row of first light-emitting devices 2 in the first display region AA1 and the second pixel drive circuits 5 corresponding to the same row of second light-emitting devices 3 in the second display region AA2 share one of the shift registers 6, which reaches a technical effect of synchronous scanning of the first pixel drive circuits 4 corresponding to the first light-emitting devices 2 in the same row in the first display region AA1 and the second pixel drive circuits 5 corresponding to the second light-emitting devices 3 in the same row in the second display region AA2. The situation that shift registers 6 are separately provided for the first pixel drive circuits 4 corresponding to the first light-emitting devices 2 in the first display region AA1 is avoided, such that the technical solution is simplified, and the production cost is reduced.

It should be noted that in the present disclosure, densities of the plurality of first light-emitting devices 2 in the first display region AA1 are the same as densities of the plurality of second light-emitting devices 3 in the second display region AA2, so as to improve the integral display effect. In addition, in the present disclosure, the first light-emitting devices 2 and the second light-emitting devices 3 refer to pixels practically used for emitting light, not including dummy pixels. Dummy pixels are of a laminated structure consisting of an anode, a light-emitting layer (EL) and a cathode, but since the dummy pixels are not connected to signal lines, the dummy pixels are not pixels used for emitting light. Similarly, the first pixel drive circuits 4 and the second pixel drive circuits 5 are circuits for connecting light-emitting pixels. In addition, in the present disclosure, a shape of the first display region AA1 may be a square shown in FIG. 1, may also be a circle or other shapes, and may be designed according to actual requirements, which is not limited here.

Optionally, in the above display substrate provided by the embodiments of the present disclosure, as shown in FIG. 2 to FIG. 4, the frame region BB includes: a first frame region BB1 adjacent to the first display region AA1, a second frame region BB2 opposite to the first frame region BB1, and a third frame region BB3 and a fourth frame region BB4 connecting the first frame region BB1 and the second frame region BB2. The second display region AA2 may be located between the first display region AA1 and the second frame region BB2, between the first display region AA1 and the third frame region BB3, and between the first display region AA1 and the fourth frame region BB4. That is, the second display region AA2 may surround a left side, a lower side and a right side of the first display region AA1, and an upper side boundary of the first display region AA1 coincides with an upper side boundary of the second display region AA2. Further, the second display region AA2 may also surround the first display region AA1, which is not limited here.

Optionally, the plurality of first pixel drive circuits 4 may be located in the first frame region BB1. The plurality of shift registers 6 may be located in at least one of the third frame region BB3 and the fourth frame region BB4. The display substrate may further include: a plurality of wires 7 located in at least one of the third frame region BB3 and the fourth frame region BB4 adjacent to the first display region AA1 and in the first frame region BB1. One end of each wire 7 is connected to one of the shift registers 6, and the other end is connected to at least one of the first pixel drive circuits 4. The first light-emitting devices 2 electrically connected to the above at least one of the first pixel drive circuits 4 respectively are arranged in the same row. By nearby arranging the plurality of wires 7 in the frame region BB where the shift registers 6 and the first pixel drive circuits 4 are located, wiring lengths of the wires 7 may be effectively decreased.

Figure 5:
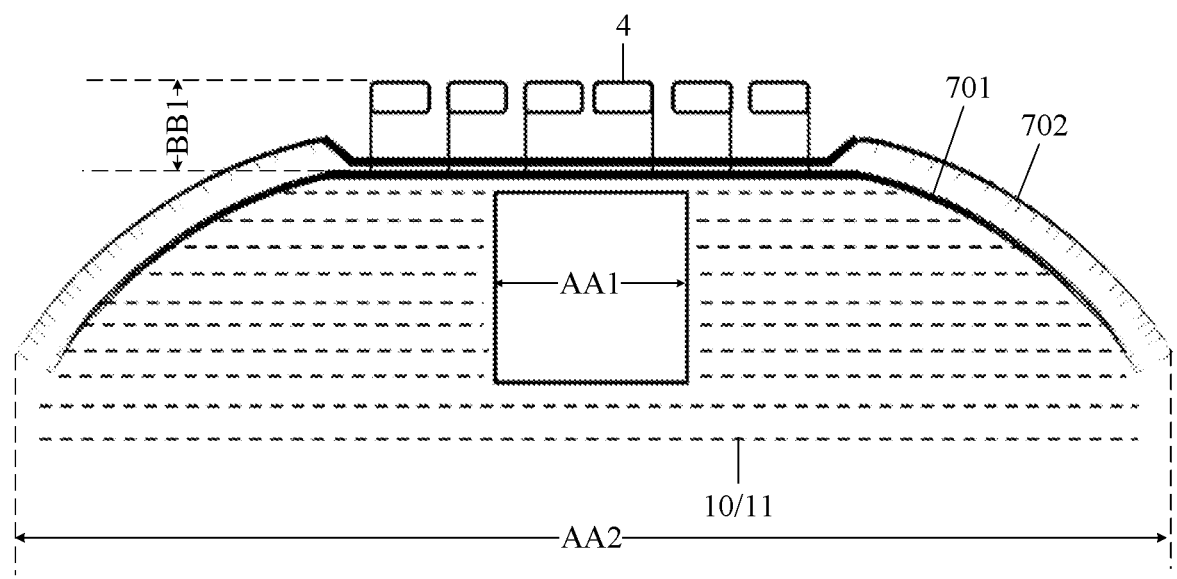
FIG. 5 is yet another enlarged schematic structural diagram of a region 'a' in FIG. 2.
Figure 6:
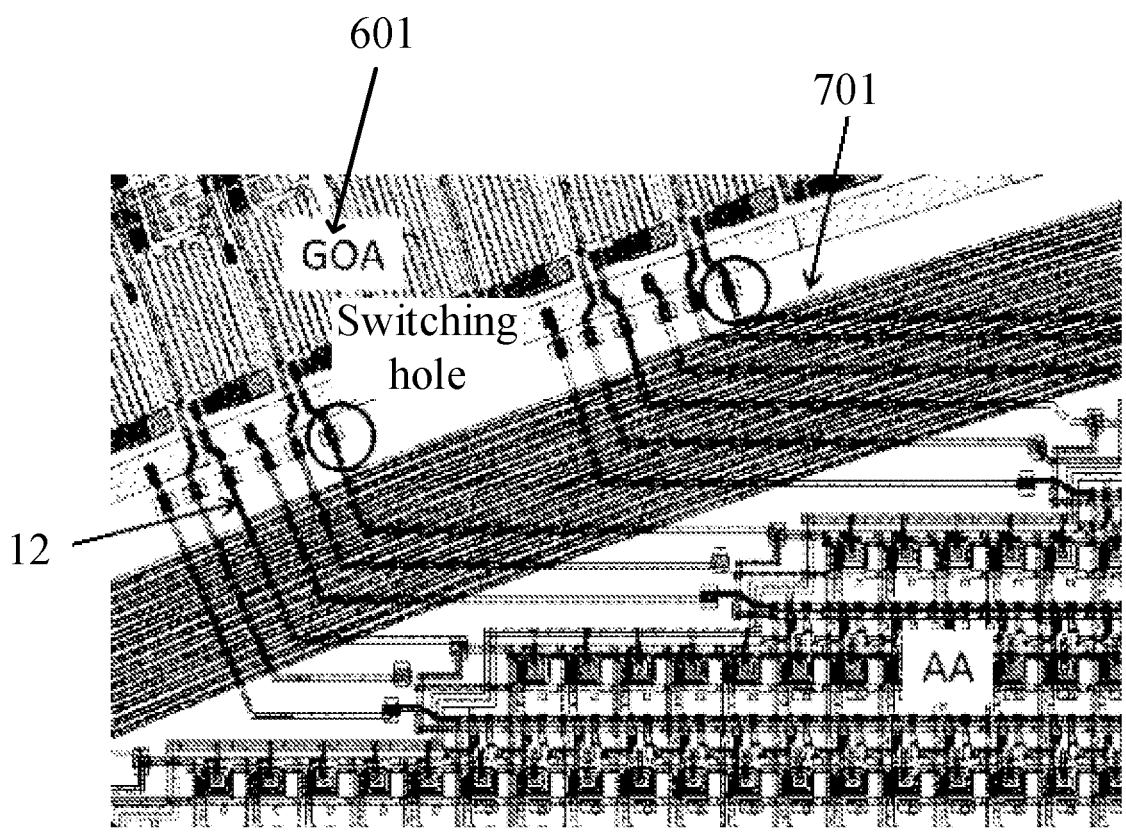
FIG. 6 is a signal wiring diagram of a first shift register provided by an embodiment of the present disclosure.

Optionally, in the above display substrate provided by the embodiments of the present disclosure, as shown in FIG. 3 to FIG. 5, the plurality of cascaded shift registers 6 are divided into two groups. One group of the plurality of cascaded shift registers 6 are at least located in the third frame region BB3, and the other group of the plurality of cascaded shift registers 6 are at least located in the fourth frame region BB4. The plurality of first pixel drive circuits 4 may be located in the first frame region BB1. The plurality of wires 7 are located in the third frame region BB3 and the fourth frame region BB4 adjacent to the first display region AA1 and in the first frame region BB1. Each wire 7 is connected to one of the shift registers 6 and a plurality of first pixel drive circuits 4 corresponding to the adjacent half row of the first light-emitting devices 2. For example, in FIG. 3 and FIG. 4, three first light-emitting devices from the left (namely half row) in the six first light-emitting devices 2 in the first row adjacent to the first frame region BB1 may electrically connect to three first pixel drive circuits from the left in the six first pixel drive circuits 4 on the left side of the first frame region BB1 respectively, and three first light-emitting devices from the right (namely half row) in the six first light-emitting devices 2 in the first row may electrically connect to three first pixel drive circuits from the right in the six first pixel drive circuits 4 on the right side of the first frame region BB1 respectively. Three first light-emitting devices from the left (namely half row) in the six first light-emitting devices 2 in the second row may electrically connect to three first pixel drive circuits from the right in the six first pixel drive circuits 4 on the left side of the first frame region BB1 respectively, and three first light-emitting devices from the right (namely half row) in the six first light-emitting devices 2 in the second row may electrically connected to three first pixel drive circuits from the left in the six first pixel drive circuits 4 on the right side of the first frame region BB1 respectively. Accordingly, four wires 7 may be correspondingly and electrically connected to the three first pixel drive circuits from the right in the six first pixel drive circuits 4 on the left side of the first frame region BB1, the three first pixel drive circuits from the left in the six first pixel drive circuits 4 on the left side, the three first pixel drive circuits from the left in the six first pixel drive circuits 4 on the right side, and the three first pixel drive circuits from the right in the six first pixel drive circuits 4 on the right side respectively.

By arranging the plurality of first pixel drive circuits 4 in the upper frame region BB1 adjacent to the first display region AA1, lengths of transparent wires connecting the first pixel drive circuits 4 and the first light-emitting devices 2 may be effectively decreased, then resistances of the transparent wires are decreased, and the long-range uniformity of drive signals is improved. In addition, by respectively arranging the plurality of shift registers 6 which are cascaded in two groups in the third frame region BB3 and the fourth frame region BB4, drive signals may be provided for pixel drive circuits electrically connected to each row of light-emitting devices by two shift registers 6, such that a time difference of the pixel drive circuits electrically connected to the light-emitting devices in the same row receiving the drive signals is effectively decreased, and a synchronous display effect is improved.

Optionally, the above display substrate provided by the embodiments of the present disclosure includes: a first gate metal layer (Gate1), a second gate metal layer (Gate2), a first source-drain metal layer (SD1) and a second source-drain metal layer (SD2) which are stacked and insulated from one another. The plurality of wires 7 may be arranged on the same layer with at least one of the first gate metal layer, the second gate metal layer and the second source-drain metal layer. Generally, the shift register 6, the first pixel drive circuits 4 and the second pixel drive circuits 5 may each has a plurality of transistors and at least one capacitor, gates of the transistors and a first electrode plate of the capacitor may be located on the first gate metal layer, a second electrode plate of the capacitor may be located on the second gate metal layer, and source electrodes and drain electrodes of the capacitors may be located on the first source-drain metal layer.

It should be understood that in the present disclosure, "arranging on the same layer" refers to forming a film layer for manufacturing a specific pattern by adopting one same film forming process, and then forming a layer structure by using one same mask through a one-time composition process. That is, the one-time composition process corresponds to one mask (also called a photomask). According to a difference of different specific patterns, the one-time composition process may include multiple exposure, developing or etching processes, the specific pattern in the formed layer structure may be continuous or discontinuous, and these specific patterns may be at different heights or have different thicknesses.

Optionally, in the above display substrate provided by the embodiments of the present disclosure, as shown in FIG. 3 to FIG. 7, each group of the plurality of cascaded shift registers 6 may include: a plurality of first shift registers 601 which are cascaded and a plurality of second shift registers 602 which are cascaded. The plurality of first shift registers 601 may be used for providing gate scanning signals (Gate), and the plurality of second shift registers 602 may be used for providing light-emitting control signals (EM). The plurality of wires 7 may include: a plurality of first wires 701 arranged on the same layer with at least one of the first gate metal layer, the second gate metal layer and the second source-drain metal layer, and a plurality of second wires 702 arranged on the same layer with at least one of the first gate metal layer and the second gate metal layer. Each first wire 701 is electrically connected to one of the first shift registers 601, and a plurality of first pixel drive circuits 4 corresponding to the adjacent half row of first light-emitting devices 2. Each second wire 702 is electrically connected to one of the second shift registers 602, and a plurality of first pixel drive circuits 4 corresponding to the adjacent half row of first light-emitting devices 2.

Figure 7:
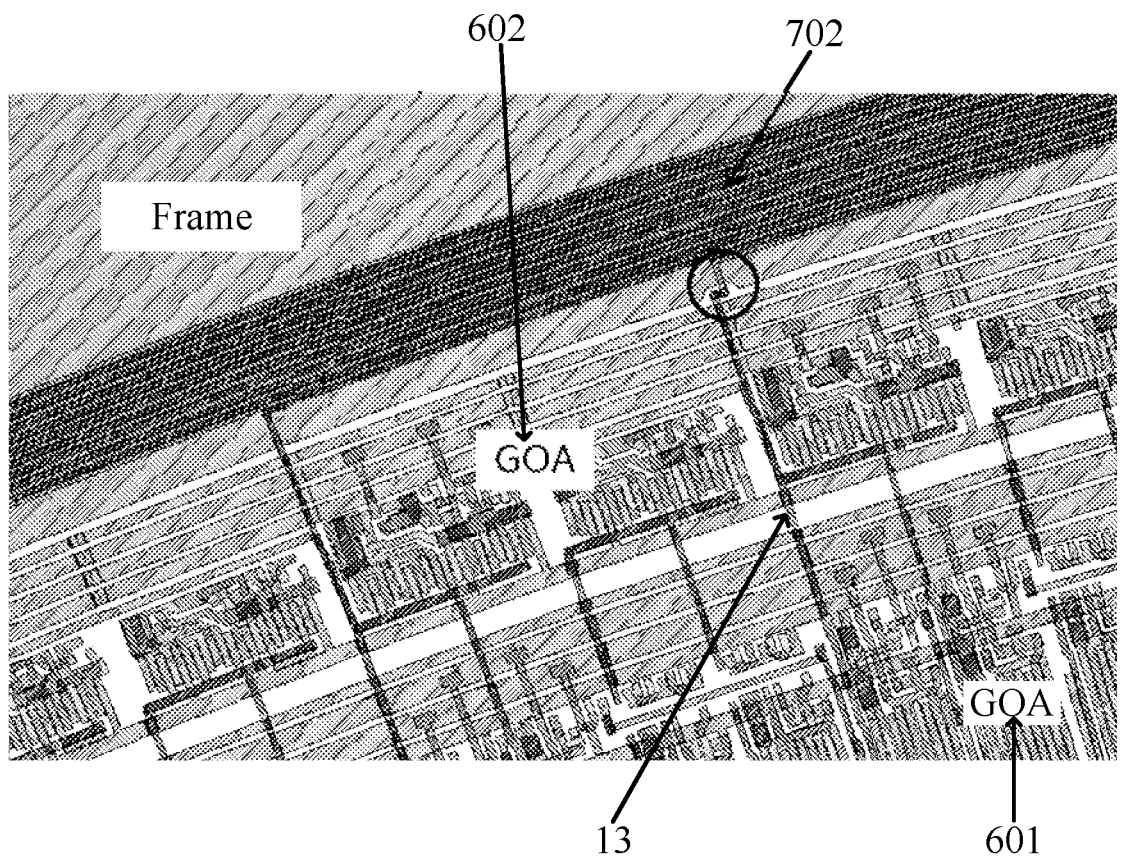
FIG. 7 is a signal wiring diagram of a second shift register provided by an embodiment of the present disclosure.

The gate scanning signals of the first shift registers 601 are provided for the second pixel drive circuits 5 in the display region AA through the first source-drain metal layer. The first wires 701 electrically connected to the first pixel drive circuits 4 may use the first gate metal layer, the second gate metal layer and the second source-drain metal layer for winding through layer switching. The first source-drain metal layer may be simply and conveniently switched to the first gate metal layer, the second gate metal layer and the second source-drain metal layer respectively through one switching hole. Therefore, a wiring mode is optimized. During implementations, the switching hole is determined according to the actual wiring situation, and a specific position is not required. In addition, as shown in FIG. 7, in the related art, low level (VSS) signal lines located on the first source-drain metal layer are distributed on a side of the shift registers 6 away from the display region AA. Therefore, the second wires 702 connecting the second shift registers 602 and the first pixel drive circuits 4 may switch layers to the first gate metal layer and/or the second gate metal layer for winding, so as to reduce the wiring pressure of the shift registers 6 in the frame region BB away from the display region AA.

Optionally, in the above display substrate provided by the embodiments of the present disclosure, as shown in FIG. 3 to FIG. 7, when the plurality of first cascaded shift registers 601 are located between the plurality of second cascaded shift registers 602 and the display region AA, each first wire 701 may be bent from one side of the first shift registers 601 close to the display region AA to the first frame region BB1 between the first pixel drive circuits 4 and the display region AA. Each second wire 702 may be bent from one side of the second shift registers 602 away from the display region AA to the first frame region BB1 between the first pixel drive circuits 4 and the display region AA.

It can be seen that the first wires 701 and the second wires 702 respectively bypass the display region AA from two sides of the shift registers 6 to be connected to positions of the first pixel drive circuits 4 in the frame region BB, which avoids changing of original signal lines in the display region AA (such as grid lines and light-emitting control lines) electrically connected to the shift registers 6, and the wiring design of the first wires 701 and the second wires 702 is optimized. In addition, bent parts of the first wires 701 and the second wires 702 may be an arc shown in FIG. 3, or may be in a right angle type shown in FIG. 4, which is not limited here.

Figure 8:
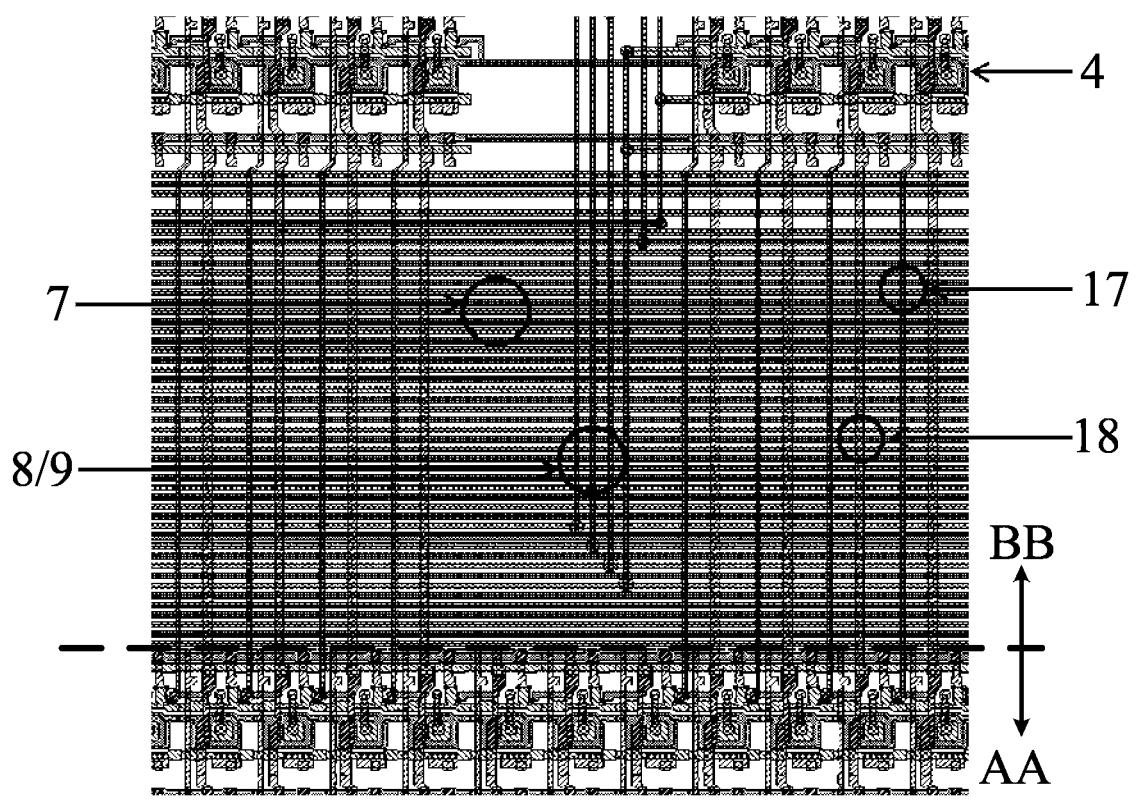
FIG. 8 is a signal switching wiring diagram of a shift register provided by an embodiment of the present disclosure.

Optionally, the above display substrate provided by the embodiments of the present disclosure, as shown in FIG. 3 and FIG. 4, may further include: a plurality of first switching connection lines 8 and a plurality of second switching connection lines 9 which are located in the first frame region BB1 and are arranged on the same layer with the first source-drain metal layer. Each first switching connection line 8 is connected to one of the first wires 701 and one of the pixel drive circuits 4, and each second switching connection line 9 is connected to one of the second wires 702 and one of the pixel drive circuits 4. During implementations, the plurality of first switching connection lines 8 and the plurality of second switching connection lines 9 may perform longitudinal wiring on the first source-drain metal layer, so as to simply and conveniently switch the plurality of first wires 701 and the plurality of second wires 702 with horizontal wiring in the first frame region BB1 through a switching hole, as shown in FIG. 8.

Optionally, the above display substrate provided by the embodiments of the present disclosure, as shown in FIG. 3 to FIG. 7, generally may further include: a plurality of grid lines 10 and a plurality of light-emitting control lines 11 which are located in the second display region AA2 and are arranged on the same layer with the first gate metal layer, and a plurality of third switching connection lines 12 and a plurality of fourth switching connection lines 13 which are located in the third frame region BB3 and the fourth frame region BB4 and are arranged on the same layer with the first source-drain metal layer. Each grid line 10 is electrically connected to the half row of second pixel drive circuits 5, and is electrically connected to one of the first shift registers 601 through one of the third switching connection lines 12. Each light-emitting control line 11 is electrically connected to the half row of second pixel drive circuits 5, and is electrically connected to one of the second shift registers 602 through one of the fourth switching connection lines 13.

It can be seen from the above in the present disclosure, the gate scanning signals of the first shift registers 601 are provided for the grid lines 10 in the display region AA through the third switching connection lines 12 of the first source-drain metal layer. The light-emitting control signals of the second shift registers 602 are provided for the light-emitting control lines 11 in the display region AA through the fourth switching connection lines 13 of the first source-drain metal layer. A wiring mode of original grid lines 10 and light-emitting control lines 11 is not changed, and therefore, the compatibility with the related art is better.

As shown in FIG. 1, for the pixel drive circuits (such as D_1 and D_2 in FIG. 1) placed in the upper frame region BB1 in the related art, data lines providing data signals Data are wound to the pixel drive circuits (such as D_1 and D_2 in FIG. 1) along an edge of the first display region AA1 through one or more film layers. The wiring mode will occupy a part of a transmitting area of the first display region AA1, which affects a photographing effect. Further, the data lines need to perform horizontal wiring after being wound and extending from the edge of the first display region AA1 to the upper frame region BB1 to be connected to a position corresponding to the pixel drive circuits, such that a part of the frame region will be occupied, and the wiring space is limited, or the frame region is increased.

Based on this, the above display substrate provided by the embodiments of the present disclosure, as shown in FIG. 3 and FIG. 4, may further include: a plurality of data lines 14 located in the second display region AA2. Each data line 14 is connected to the first pixel drive circuits 4 and the second pixel drive circuits 5 electrically connected to one column of first light-emitting devices 2 and one column of second light-emitting devices 3 respectively. The above column of first light-emitting devices 2 and the above column of second light-emitting devices 3 are arranged in the same column.

The first pixel drive circuits 4 and the second pixel drive circuits 5 electrically connected to one column of first light-emitting devices 2 and the one column of second light-emitting devices 3 respectively share the data line 14 in the second display region AA2, so as to avoid the situation that data signals are provided for the first pixel drive circuits 4 through winding in the first display region AA1, and thus a photographing effect of an under-screen camera is improved.

Optionally, the above display substrate provided by the embodiments of the present disclosure, as shown in FIG. 3, FIG. 4, FIG. 9 to FIG. 11, may further include: a plurality of third wires 15 extending in a row direction and a plurality of fourth wires 16 extending in a column direction in the second display region AA2.

The data lines 14 directly facing the first display region AA1 is connected to at least one of the fourth wires 16 through one of the third wires 15. Each fourth wire 16 is correspondingly and electrically connected to one of the first pixel drive circuits 4. The first light-emitting devices 2 corresponding to the first pixel drive circuits 4 electrically connected to the at least one of the fourth wires 16 respectively are arranged in the same column.

It should be noted that "directly facing" in the present disclosure refers that an extension line of the data line 14 mutually overlaps the first display region AA1.

Data signals provided by the data lines 14 are transferred to the first pixel drive circuits 4 through the third wires 15 and the fourth wires 16 arranged in the second display region AA2, which avoids that data signals are provided for the first pixel drive circuits 4 through winding in the first display region AA1, and the a photographing effect of the under-screen camera is improved. Further, the third wires 15 extending in the row direction are completed in the second display region AA2 and wire using is optimized, which reduces the wiring pressure of other signal lines in the upper frame region BB1.

During implementations, in order to prevent mutual crosstalk among data signals, a horizontal wiring space required by one of the third wires 15 may be additionally reserved in a general 7T1C pixel drive circuit for switching of the data lines 14 from the first source-drain metal layer to the second gate metal layer where the thirds wires 15 are located. A longitudinal wiring space required by one of the fourth wires 16 is additionally reserved for switching of the third wires 15 from the second gate metal layer to the second source-drain metal layer where the fourth wires 16 are located. Switching holes may be adjacent, and may also be determined according to sizes and structures of pixels, and specific positions are not required. In addition, the third wires 15 may perform interlaced wiring, the fourth wires 16 may perform interlaced wiring, and under the premise of not affecting functions of an original 7T1C pixel drive circuit, specific positions of the third wires 15 and the fourth wires 16 in the general 7T1C pixel drive circuit are not required.

Figure 9:
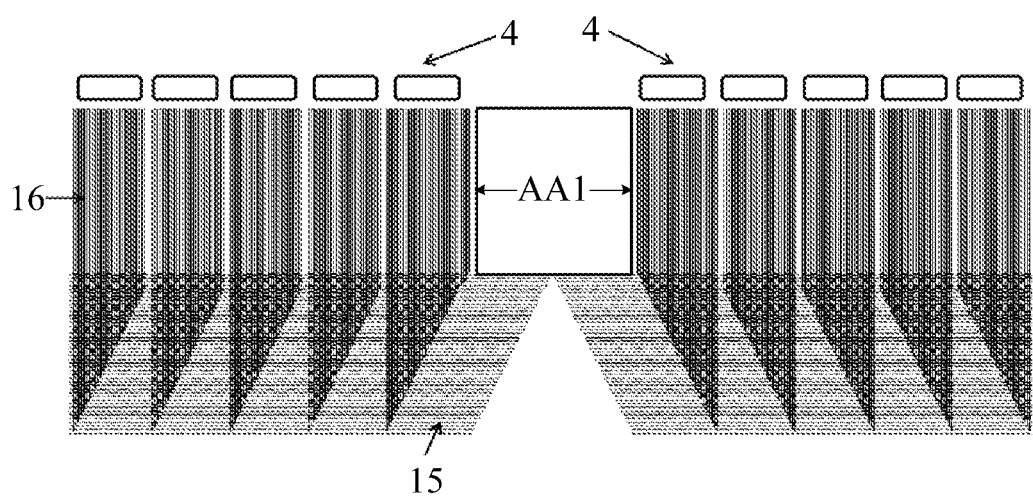
FIG. 9 is a data signal wiring diagram of a first drive pixel circuit provided by an embodiment of the present disclosure.
Figure 10:
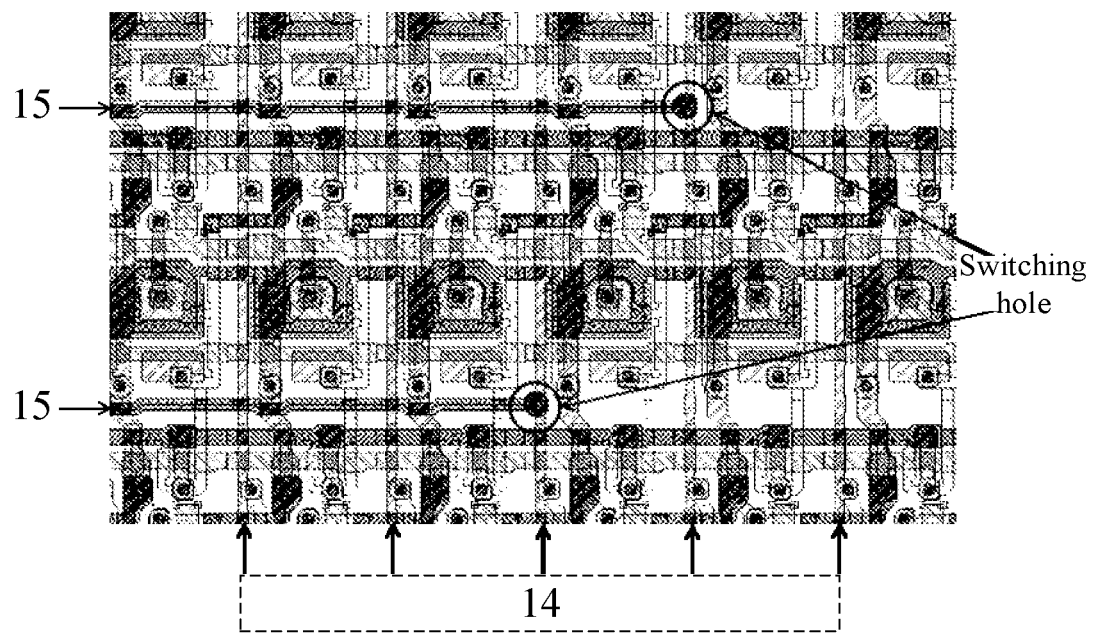
FIG. 10 is a horizontal switching diagram of data signals in a display region provided by an embodiment of the present disclosure.
Figure 11:
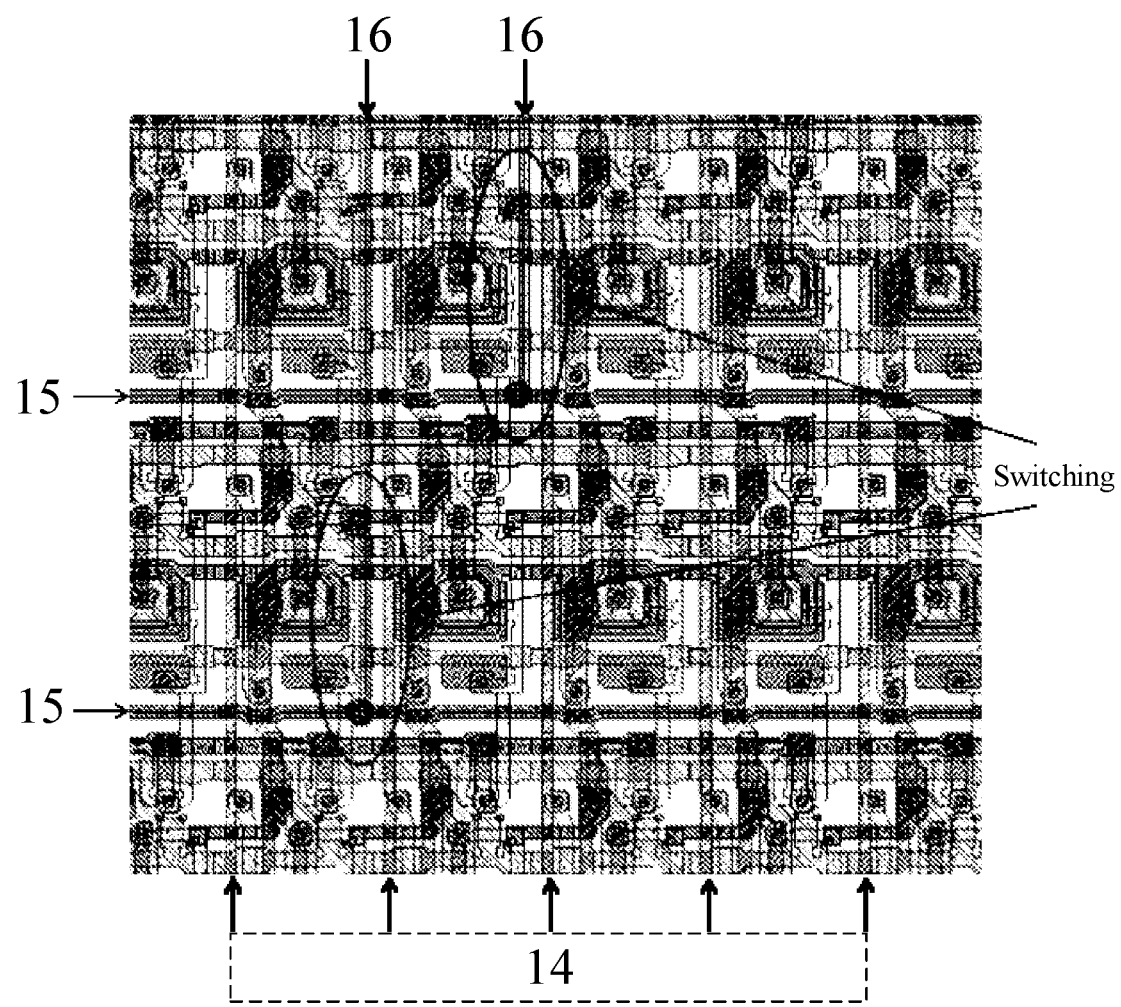
FIG. 11 is a longitudinal switching diagram of data signals in a display region provided by an embodiment of the present disclosure.

Optionally, in the above display substrate provided by the embodiments of the present disclosure, as shown in FIG. 3, FIG. 4 and FIG. 9, the third wires 15 may be located at a plurality of row gaps adjacent to the first display region AA1, and two third wires 15 are arranged at the same row gap. The fourth wires 16 are arranged at a plurality of column gaps adjacent to the first display region AA1 in a one-to-one correspondence manner. In other words, after the data lines 14 led from a source electrode drive circuit (IC) end reach the first display region AAT, the data lines may be subsequently switched to the left and right sides of the first display region AA1 row by row for wiring through the third wires 15 at a position of the first display region AA1 close to the IC end, and then subsequently switched to the first pixel drive circuits 4 column by column through the fourth wires 16.

The above row gaps refer to gaps among pixel rows formed by the plurality of second light-emitting devices 3 in the second display region AA2, and the column gaps refer to gaps among pixel columns formed by the plurality of second light-emitting devices 3 in the second display region AA2.

Optionally, the above display substrate provided by the embodiments of the present disclosure, as shown in FIG. 3 and FIG. 4, may further include: a plurality of fifth switching connection lines 17 located in the frame region BB adjacent to the first display region AA1. Each fifth switching connection line 17 is correspondingly connected to one of the fourth wires 16 and one of the first pixel drive circuits 4. That is, the fifth switching connection lines 17 transfer the data signals provided by the fourth wires 16 to the corresponding first pixel drive circuits 4.

Optionally, in the above display substrate provided by the embodiments of the present disclosure, the plurality of data lines 14 and the plurality of fifth switching connection lines 17 may be arranged on the same layer with the first source-drain metal layer. The plurality of third wires 15 may be arranged on the same layer with the second gate metal layer. The plurality of fourth wires 16 may be arranged on the same layer with the second source-drain metal layer. Therefore longitudinally transferred data signals are switched to the first source-drain metal layer where the fifth switching connection lines 17 are located again from the second source-drain metal layer where the fourth wires 16 are located at a boundary of the display region AA, and then connected to the corresponding first pixel drive circuits 4. Switching holes may be determined according to the actual wiring condition, and the specific positions are not required.

Figure 12:
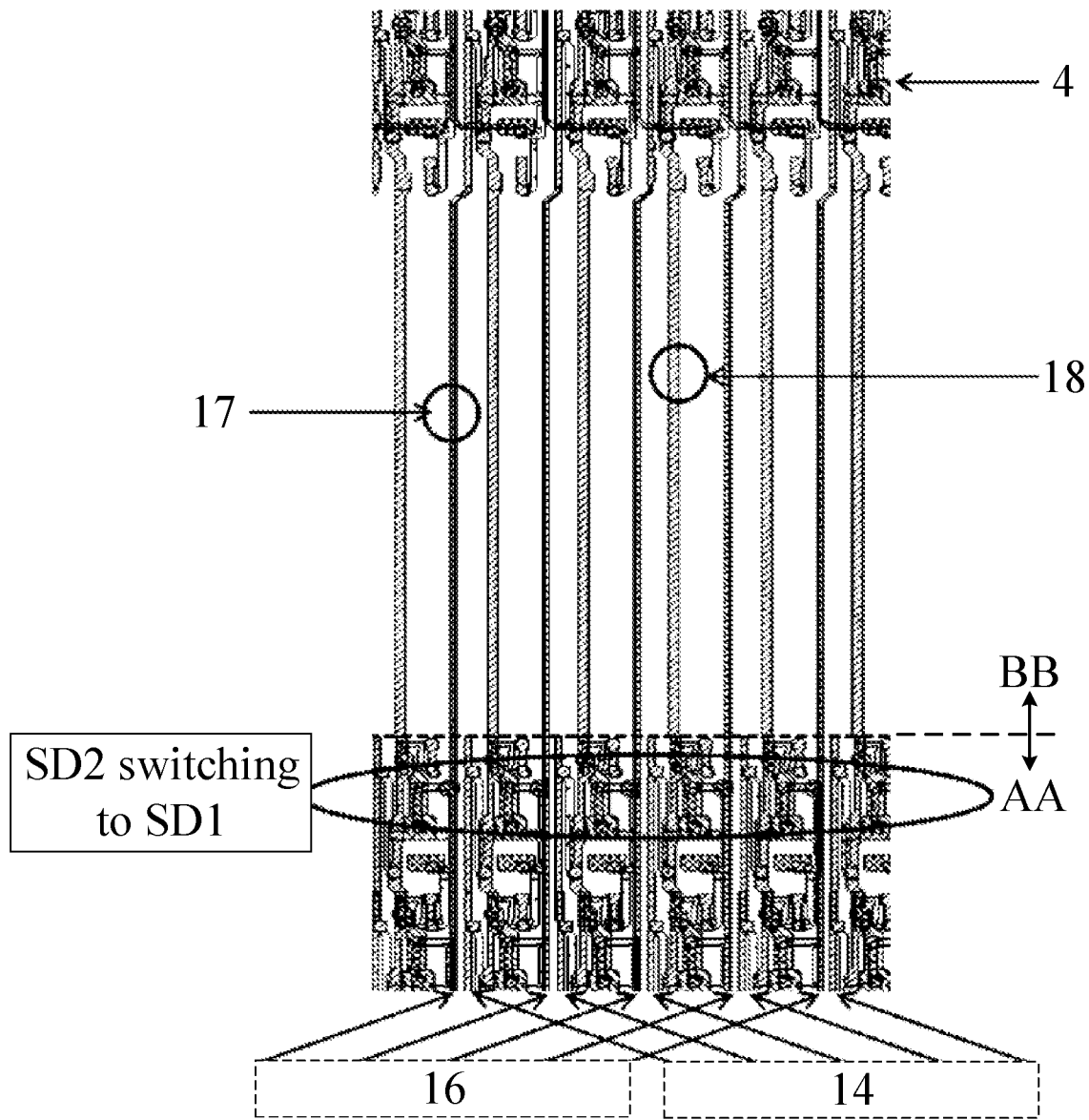
FIG. 12 is a longitudinal switching diagram of data signals in a frame region provided by an embodiment of the present disclosure.

Optionally, the above display substrate provided by the embodiments of the present disclosure, as shown in FIG. 12, may further include: a plurality of power signal (VDD) lines 18 extending in the column direction. Each power signal line 18 is electrically connected to one column of second pixel drive circuits 5. Alternatively, each power signal line 18 is electrically connected to the first pixel drive circuits 4 and the second pixel drive circuits 5 which are located in the same column. For example, the power signal lines 18 may use the first source-drain metal layer to be directly connected to the first pixel drive circuits 4 of the frame region BB from the display region AA.

Optionally, the above display substrate provided by the embodiments of the present disclosure, may further include: a plurality of initialized signal (Vinit) lines extending in the row direction in the second display region AA2, and a plurality of sixth switching connection lines located in the frame region BB. Each initialized signal line is electrically connected to half row of second pixel drive circuits 5. Each of the initialized signal lines located on the two sides, in the row direction, of the first display region AA1 is electrically connected to the first pixel drive circuits 4 corresponding to the first light-emitting devices 2 in the row through one sixth switching connection line. Certainly, during implementations, an arrangement mode of the initialized signal lines may further be similar to that of the power signal lines 18, which is not limited here.

Figure 13:
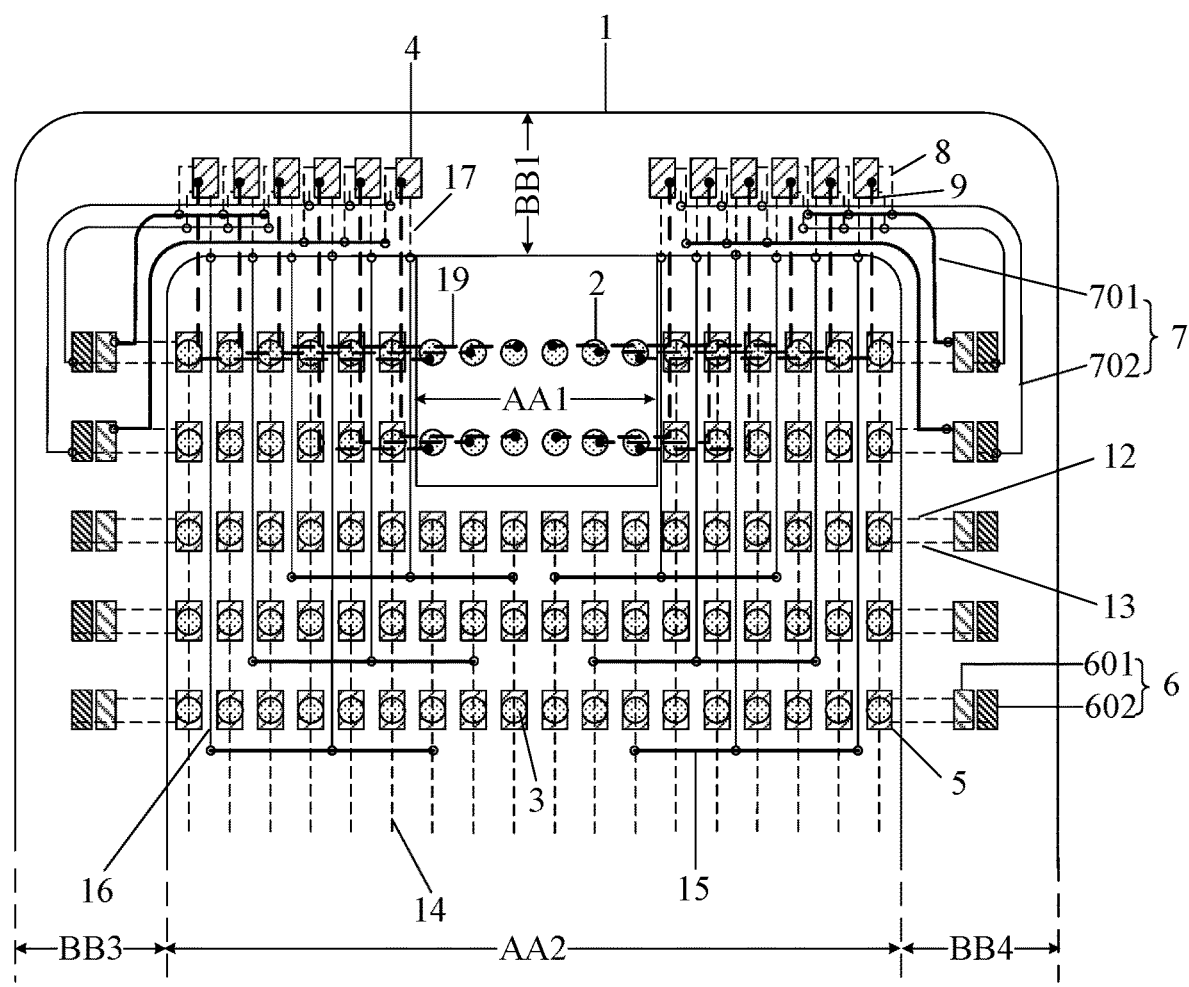
FIG. 13 is yet another enlarged schematic structural diagram of a region 'a' in FIG. 2.
Figure 14:
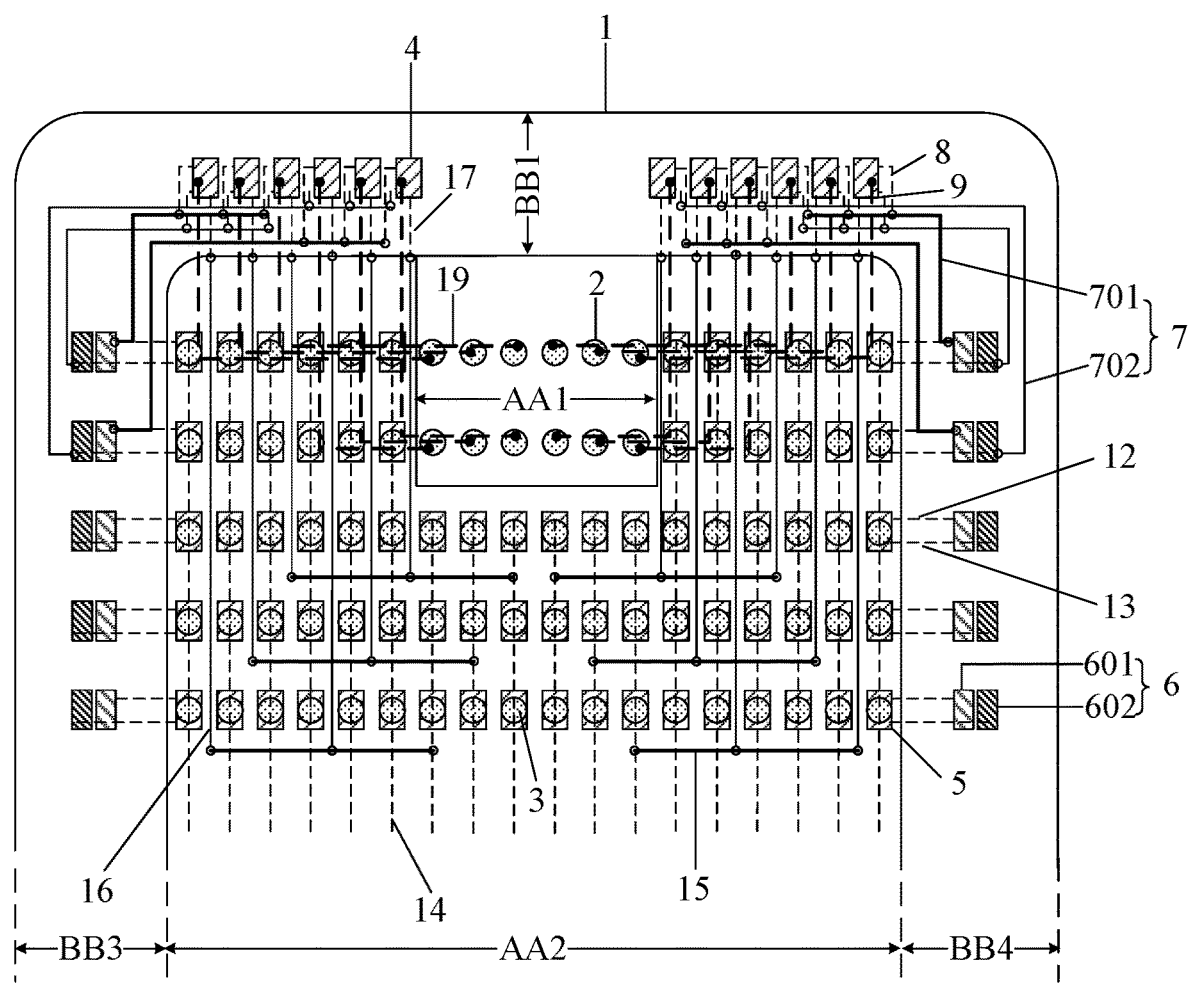
FIG. 14 is yet another enlarged schematic structural diagram of a region 'a' in FIG. 2.

Optionally, the above display substrate provided by the embodiments of the present disclosure, as shown in FIG. 13 and FIG. 14, may further include: a plurality of transparent wires 19 located between a layer where the plurality of pixel drive circuits are located and a layer where the plurality of light-emitting devices are located. The transparent wires 19 are connected between the first pixel drive circuits 4 and the first light-emitting devices 2 in a one-to-one correspondence manner.

During implementations, in order to provide more transparent wires 19 in the column direction within a certain size range to drive more first light-emitting devices 3, then to meet the same resolution ratio of the first display region AA1 and the second display region AA2, in the present disclosure, the plurality of transparent wires 19 may be arranged on different film layers. In some embodiments, the plurality of transparent wires 19 may be respectively located on a first transparent conducting layer, a second transparent conducting layer and a third transparent conducting layer. The plurality of first light-emitting devices 2 include a plurality of first color light-emitting devices R, a plurality of second color light-emitting devices G and a plurality of third color light-emitting devices B. The first pixel drive circuits 4 include first sub-pixel drive circuits, second sub-pixel drive circuits and third sub-pixel drive circuits. One ends of the transparent wires 19 located on the first transparent conducting layer may be electrically connected to the first sub-pixel drive circuits, and the other ends may be correspondingly and electrically connected to the first color light-emitting devices R. One ends of the transparent wires 19 located on the second transparent conducting layer may be electrically connected to the second sub-pixel drive circuits, and the other ends may be correspondingly and electrically connected to the second color light-emitting devices G. One ends of the transparent wires 19 located on the third transparent conducting layer may be electrically connected to the third sub-pixel drive circuits, and the other ends may be correspondingly and electrically connected to the third color light-emitting devices B.

Optionally, in the above display substrate provided by the embodiments of the present disclosure, the first display region AA1 is configured to install a light-extracting module, such as a camera module, an optical fingerprint identification module and an ambient light sensor.

In another aspect, embodiments of the present disclosure further provide a display panel, including the above display substrate provided by the embodiments of the present disclosure.

Optionally, the display panel may be an organic electroluminescence display panel (OLED), a quantum dot light-emitting display panel (QLED) or a micro light-emitting diode display panel (Micro LED). Since the principle of the display panel solving the problem is similar to the principle of the above display substrate solving the problem, the implementation of the display panel provided by the embodiments of the present disclosure may refer to the implementation of the above display substrate provided by the embodiments of the present disclosure, and repetitions are omitted.

In yet another aspect, embodiments of the present disclosure further provide a display apparatus, including: a light-extracting module (such as a camera module) and the above display panel. The light-extracting module is arranged in the first display region AA1 of the display panel.

The display apparatus may be a mobile phone, a tablet computer, a television, a display, a notebook computer, a digital photo frame, a navigator, a smart watch, a fitness wristband, a personnel digital assistant and any products or components with display functions. Other essential constituent parts of the display apparatus should be understood by those of ordinary skill in the art, which is not repeated here, and should not limit the present disclosure. In addition, the principle of the display apparatus solving the problem is similar to the principle of the above display panel solving the problem, therefore, the implementation of the display apparatus may refer to the embodiments of the above display panel, and repetitions are omitted.

Apparently, those skilled in the art may make various changes and variations to the embodiments of the present disclosure without departing from the spirit and scope of the present disclosure. In this case, if these changes and variations of the present disclosure fall within the scope of the claims of the present disclosure and their equivalents, the present disclosure also intends to contain these changes and variations.

What is claimed is:

1. A display substrate, comprising:
   a base substrate, comprising:
   a display region; and
   a frame region around the display region;
   wherein the display region comprises:
   a first display region; and
   a second display region at least on one side of the first display region;
   a plurality of light-emitting devices, arranged on the base substrate in an array and comprising:
   a plurality of first light-emitting devices in the first display region; and
   a plurality of second light-emitting devices in the second display region;
   a plurality of pixel drive circuits, located between the base substrate and a layer where the plurality of light-emitting devices are located and comprising:
   a plurality of first pixel drive circuits in the frame region; and
   a plurality of second pixel drive circuits in the second display region;
   wherein the plurality of first pixel drive circuits are electrically connected to the plurality of first light-emitting devices in a one-to-one correspondence manner, and the plurality of second pixel drive circuits are electrically connected to the plurality of second light-emitting devices in a one-to-one correspondence manner; and
   a plurality of shift registers cascaded in the frame region;
   wherein each shift register is connected to the first pixel drive circuits and the second pixel drive circuits which are electrically connected to one row of first light-emitting devices and one row of second light-emitting devices respectively; wherein the one row of first light-emitting devices and the one row of second light-emitting devices are in a same row.

2. The display substrate according to claim 1, wherein:
the frame region comprises:
a first frame region adjacent to the first display region;
a second frame region opposite to the first frame region; and
a third frame region and a fourth frame region which are connected to the first frame region and the second frame region;
wherein the plurality of first pixel drive circuits are in the first frame region; and
the plurality of shift registers are at least located in at least one of the third frame region and the fourth frame region; and
the display substrate further comprises:
a plurality of wires in at least one of the third frame region and the fourth frame region adjacent to the first display region and in the first frame region;
wherein, one end of each wire is connected to one of the shift registers, the other end of the each wire is connected to at least one of the first pixel drive circuits; wherein the first light-emitting devices electrically connected to the at least one of the first pixel drive circuits respectively are arranged in a same row.

3. The display substrate according to claim 2, wherein the plurality of shift registers cascaded are divided into two groups, one group of the plurality of shift registers cascaded are at least in the third frame region, and the other group of the plurality of shift registers cascaded are at least in the fourth frame region;
the plurality of first pixel drive circuits are in the first frame region; and
the plurality of wires are in the third frame region and the fourth frame region adjacent to the first display region and the first frame region, wherein each wire is connected to one of the shift registers and the plurality of first pixel drive circuits corresponding to an adjacent half row of the first light-emitting devices.

4. The display substrate according to claim 3, comprising:
a first gate metal layer, a second gate metal layer, a first source-drain metal layer and a second source-drain metal layer which are stacked and insulated from one another;
wherein the plurality of wires are arranged on a layer same as at least one of the first gate metal layer, the second gate metal layer and the second source-drain metal layer.

5. The display substrate according to claim 4, wherein:
each group of the plurality of shift registers cascaded comprise:
a plurality of first shift registers cascaded; and
a plurality of second shift registers cascaded; and
the plurality of wires comprise:
a plurality of first wires arranged on a layer same as at least one of the first gate metal layer, the second gate metal layer and the second source-drain metal layer; and
a plurality of second wires arranged on a layer same as at least one of the first gate metal layer and the second gate metal layer;
wherein each first wire is electrically connected to one of the first shift registers and the plurality of first pixel drive circuits corresponding to an adjacent half row of the first light-emitting devices; and each second wire is electrically connected to one of the second shift registers and the plurality of first pixel drive circuits corresponding to an adjacent half row of the first light-emitting devices.

6. The display substrate according to claim 5, wherein:
the first shift registers cascaded are between the plurality of second shift registers cascaded and the display region;
each first wire is bent from one side of the first shift registers close to the display region to the first frame region between the first pixel drive circuits and the display region; and
each second wire is bent from one side of the second shift registers away from the display region to the first frame region between the first pixel drive circuits and the display region.

7. The display substrate according to claim 6, further comprising:
a plurality of first switching connection lines and a plurality of second switching connection lines which are located in the first frame region and arranged on a layer same as the first source-drain metal layer;
wherein each first switching connection line is connected to one of the first wires and one of the first pixel drive circuits, and each second switching connection line is connected to one of the second wires and one of the first pixel drive circuits.

8. The display substrate according to claim 5, further comprising:
a plurality of grid lines and a plurality of light-emitting control lines which are located in the second display region and arranged on a layer same as the first gate metal layer; and
a plurality of third switching connection lines and a plurality of fourth switching connection lines which are located in the third frame region and the fourth frame region and arranged on a layer same as the first source-drain metal layer;
wherein each grid line is electrically connected to a half row of second pixel drive circuits, and is electrically connected to one of the first shift registers through one of the third switching connection lines; and
each light-emitting control line is electrically connected to a half row of second pixel drive circuits, and is electrically connected to one of the second shift registers through one of the fourth switching connection lines.

9. The display substrate according to claim 1, further comprising:
a plurality of data lines in the second display region;
wherein each data line is connected to the first pixel drive circuits and the second pixel drive circuits which are electrically connected to one column of first light-emitting devices and one column of second light-emitting devices respectively; wherein the one column of first light-emitting devices and the one column of second light-emitting devices are arranged in a same column.

10. The display substrate according to claim 9, further comprising:
a plurality of third wires extending in a row direction and a plurality of fourth wires extending in a column direction in the second display region;
wherein the data line directly facing the first display region is connected to at least one of the fourth wires through one of the third wires, each fourth wire is electrically connected to one of the first pixel drive circuits, and the first light-emitting devices corresponding to the first pixel drive circuits electrically connected to the at least one of the fourth wires respectively are arranged in a same column.

11. The display substrate according to claim 10, wherein the third wires are in a plurality of row gaps adjacent to the first display region respectively, and two third wires are arranged in one same row gap; and the fourth wires are arranged in a plurality of column gaps at two sides, in the row direction, of the first display region in a one-to-one correspondence manner.

12. The display substrate according to claim 11, further comprising:

a plurality of fifth switching connection lines in the frame region adjacent to the first display region;

wherein each fifth switching connection line is connected to one of the fourth wires and one of the first pixel drive circuits.

13. The display substrate according to claim 12, comprising:

a first gate metal layer, a second gate metal layer, a first source-drain metal layer and a second source-drain metal layer which are stacked and insulated from one another;

wherein the data lines and the plurality of fifth switching connection lines are arranged on a layer same as the first source-drain metal layer, the plurality of third wires are arranged on a layer same as the second gate metal layer, and the plurality of fourth wires are arranged on a layer same as the second source-drain metal layer.

14. The display substrate according to claim 1, further comprising:

a plurality of power signal lines extending in a column direction;

wherein one of the power signal lines is electrically connected to one column of second pixel drive circuits; or one power signal line is electrically connected to the first pixel drive circuits and the second pixel drive circuits in a same column.

15. The display substrate according to claim 1, further comprising:

a plurality of initialized signal lines extending in a row direction in the second display region; and a plurality of sixth switching connection lines in the frame region;

wherein one of the initialized signal lines is electrically connected to a half row of second pixel drive circuits; and each of the initialized signal lines on two sides, in the row direction, of the first display region is electrically connected to the first pixel drive circuits corresponding to the first light-emitting devices in the row through one of the sixth switching connection lines.

16. The display substrate according to claim 1, further comprising:

a plurality of transparent wires between a layer where the plurality of pixel drive circuits are located and a layer where the light-emitting devices are located;

wherein the transparent wires connect the first pixel drive circuits and the first light-emitting devices in a one-to-one correspondence manner.

17. The display substrate according to claim 1, wherein the first display region is configured to install a light-extracting module.

18. A display panel, comprising the display substrate according to claim 1.

19. A display apparatus, comprising:

a light-extracting module, and the display panel according to claim 18, wherein the light-extracting module is configured to be arranged in the first display region of the display panel.

* * * * *